(12) United States Patent
Eid et al.

(10) Patent No.: US 12,532,739 B2
(45) Date of Patent: Jan. 20, 2026

(54) METAL MATRIX COMPOSITE LAYERS HAVING GRADED FILLER CONTENT FOR HEAT DISSIPATION FROM INTEGRATED CIRCUIT DEVICES

(71) Applicant: Intel Corporation, Santa Clara, CA (US)

(72) Inventors: Feras Eid, Chandler, AZ (US); Wenhao Li, Chandler, AZ (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 17/685,063

(22) Filed: Mar. 2, 2022

(65) Prior Publication Data
US 2023/0282543 A1   Sep. 7, 2023

(51) Int. Cl.
*H01L 23/373* (2006.01)
(52) U.S. Cl.
CPC ................ *H01L 23/3733* (2013.01)
(58) Field of Classification Search
CPC ............... H01L 23/3733; H01L 23/373; H01L 23/3736; H01L 23/3737
See application file for complete search history.

(56) References Cited

U.S. PATENT DOCUMENTS

| | | | |
|---|---|---|---|
| 6,124,635 A * | 9/2000 | Kuwabara | H01L 23/3735 257/E23.106 |
| 12,261,090 B2 * | 3/2025 | Ichikawa | H01L 23/3735 |
| 2007/0097651 A1 * | 5/2007 | Canale | C09K 5/14 257/E23.113 |
| 2020/0203251 A1 * | 6/2020 | Kuniyasu | C08K 3/08 |

\* cited by examiner

*Primary Examiner* — Steven B Gauthier
*Assistant Examiner* — Candice Chan
(74) *Attorney, Agent, or Firm* — Essential Patents Group, LLP

(57) ABSTRACT

An integrated circuit assembly may be fabricated to include an integrated circuit device having a backside surface and a metal matrix composite layer on the backside surface, wherein the metal matrix composite layer has a filler material disposed therein that has a graded content to reduce the coefficient of thermal expansion at the backside surface of the integrated circuit device. The filler material may have at least two filler material particle constituents having different particle diameters, wherein a first filler material particle constituent that has the smaller average diameter is closest to the backside surface of the integrated circuit device and wherein a second filler material constituent that has the larger average diameter is farthest from the backside surface of the integrated circuit device.

20 Claims, 6 Drawing Sheets

METAL MATRIX COMPOSITE LAYERS HAVING GRADED FILLER CONTENT FOR HEAT DISSIPATION FROM INTEGRATED CIRCUIT DEVICES

TECHNICAL FIELD

Embodiments of the present description generally relate to the removal of heat from integrated circuit devices, and, more particularly, to thermal management solutions wherein a metal matrix composite layer having a filler material with a graded content to reduce coefficient of thermal expansion mismatch is formed on an integrated circuit device.

BACKGROUND

The integrated circuit industry is continually striving to produce ever faster, smaller, and thinner integrated circuit (IC) devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of circuits within the integrated circuit devices has increased, which, in turn, increases the average junction temperature of the integrated circuit device. If the temperature of the integrated circuit device becomes too high, the circuits therein may be damaged or destroyed. Thus, heat dissipation devices are used to remove heat from the integrated circuit devices in an integrated circuit package. In one example of an integrated circuit package, at least one integrated circuit device may be mounted to an electronic substrate and the heat dissipation device may be thermally attached to the at least one integrated circuit device with a thermal interface material ("TIM") that is disposed between the integrated circuit device(s) and the heat dissipation device to form thermal contact therebetween. The thermal interface material may include thermal greases, gap pads, polymers, and the like.

Since the thermal interface material provides a heat transfer path from the integrated circuit device(s) to the heat dissipation device, the thermal efficiency of the thermal interface material is critical to effectively remove heat from the integrated circuit device(s). Thus, the thermal interface material should have a thermal conductivity that is higher than the primary material of the integrated circuit device(s), such as silicon. However, even the best thermal interface materials have thermal conductivities that are lower than silicon, which results in the thermal interface material becoming a thermal bottleneck.

One method of eliminating the deficiencies of thermal interface materials is to simply remove them by depositing films with higher thermal conductivity than silicon directly on the integrated circuit device, such as on the backside thereof, to help improve thermal management. Metal films, such as copper, demonstrate high thermal conductivity, but larger coefficient of thermal expansion ("CTE") than silicon. Such a mismatch in the coefficient of thermal expansion may create thermomechanical stresses at the interface of the integrated circuit device and the metal films, which can lead to potential cracking and failure of the integrated circuit device. Additionally, most deposition techniques used to form metal films are generally incompatible with the integrated circuit devices, as they require sintering with temperature exceeding 500 degrees Celsius, which can damage the integrated circuit devices.

Thus, there is a need to overcome the shortcomings of forming metal films on integrated circuit devices for thermal management.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
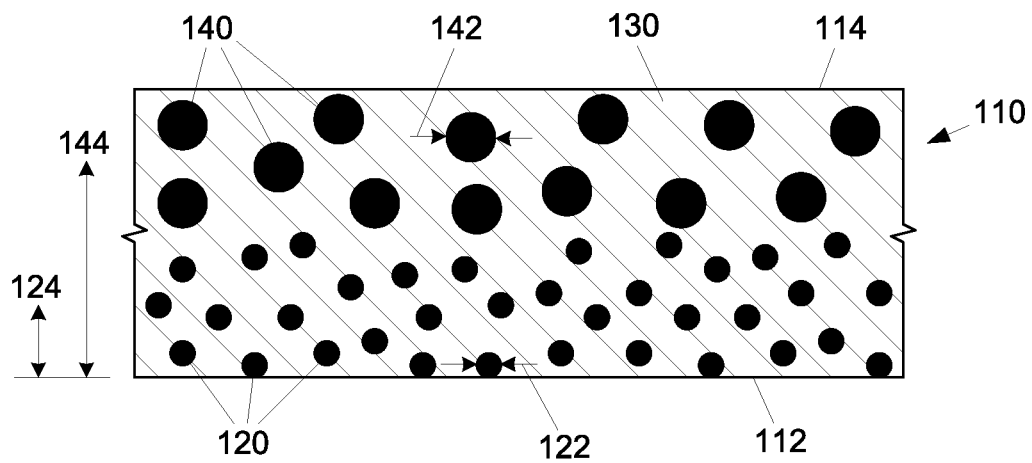
FIG. 1 is a side cross-sectional view of a metal matrix composite layer, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of a metal matrix composite layer on a backside surface of an integrated circuit device, wherein the metal matrix composite layer has a filler material disposed therein that has a graded content to adjust the thermal expansion thereof. The filler material may have at least two filler material particle constituents having different particle diameters, wherein a first filler material particle constituent, that has an average diameter, is closest to the backside surface of the integrated circuit device and wherein a second filler material constituent, that has an average diameter that is larger than the average diameter of the first filler material constituent is farthest from the backside surface of the integrated circuit device. Thus, a portion of the metal matrix composite layer closest to the at least one integrated circuit device will have the lowest coefficient of thermal expansion and closest to that of the integrated circuit device, and the coefficient of thermal expansion may increase with an increasing distance away from the integrated circuit device.

As shown in FIG. 1, in one embodiment of the present description, a metal matrix composite layer 110, having an inner surface 112 and an opposing outer surface 114, may comprise a metal material 130 and a filler material dispersed in the metal material, wherein the filler material comprises a plurality of first filler material particles 120 having an average diameter 122 and an average distance 124 from the inner surface 112 of the metal matrix composite layer 110, and a plurality of second filler material particles 140 having an average diameter 142 and an average distance 144 from the inner surface 112 of the metal matrix composite layer 110, wherein the average diameter 122 of the plurality of first filler material particles 120 is smaller than the average diameter 142 of the plurality of second filler material particles 140, and wherein the average distance 124 of the plurality of first filler material particles 120 from the inner surface 112 of the metal matrix composite layer 110 is smaller than the average distance 144 of the plurality of second filler material particles 140 from the inner surface 112 of the metal matrix composite layer 110.

In one embodiment of the present description, the first filler material particles 120 and the second filler material particles 140 may include, but are not limited to, diamond (thermal conductivity of 1000-2000 W/m*K and CTE of 1.1 ppm/K), aluminum nitride (thermal conductivity of 250-350 W/m*K and CTE of 4.5 ppm/K), silicon carbide (thermal conductivity of 200-400 W/m*K and CTE of 4 ppm/K), and the like. In an embodiment of the present description, the first filler material particles 120 and the second filler material particles 140 may be the same material. In other embodiment of the present description, the first filler material particles 120 and the second filler material particles 140 may be different materials.

In an embodiment of the present description, the metal material 130 may include, but is not limited to, copper (thermal conductivity of about 400 W/m*K and CTE of about 17 ppm/K), aluminum (thermal conductivity of about 200-250 W/m*K and CTE of about 22 ppm/K), nickel (thermal conductivity of about 70 W/m*K and CTE of 13 ppm/K), silver (thermal conductivity of about 430 W/m*K and CTE of about 19 ppm/K), gold (thermal conductivity of about 315 W/m*K and CTE of about 14 ppm/K), alloys thereof, and the like. By way of comparison, the integrated circuit device upon which the metal matrix composite layer 110 will be disposed may be formed from silicon, wherein silicon has a thermal conductivity of about 120-150 W/m*K and a CTE of about 2.6 ppm/K.

Figure 2:
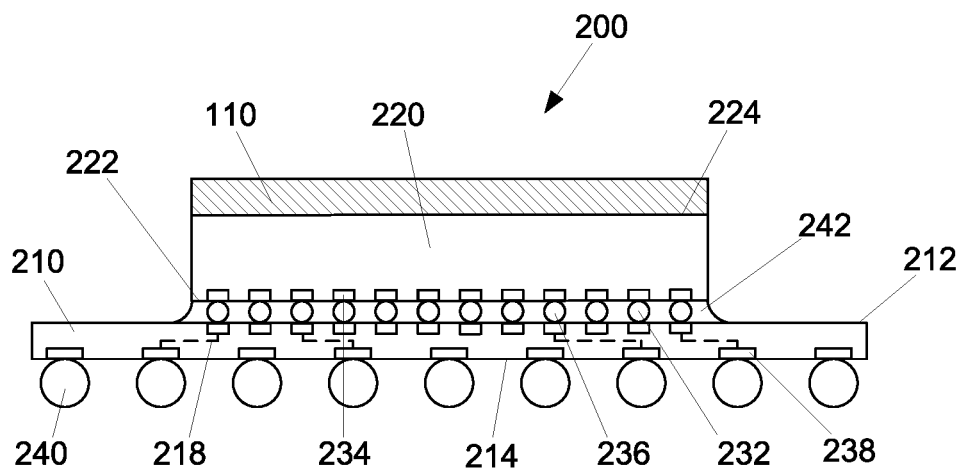
FIG. 2 is a side cross-sectional view of an integrated circuit assembly, according to an embodiment of the present description.

FIG. 2 illustrates an integrated circuit assembly 200 having at least one integrated circuit device 220 electrically attached to an electronic substrate 210 in a configuration generally known as a flip-chip or controlled collapse chip connection ("C4") configuration, according to an embodiment of the present description. In one embodiment of the present description, the metal matrix composite layer 110 of FIG. 1 may be formed on a backside surface 224 of the integrated circuit device 220, such that the inner surface 112 of the metal matrix composite layer 110 is adjacent to the backside surface 224 of the integrated circuit device 220.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

Figure 9:
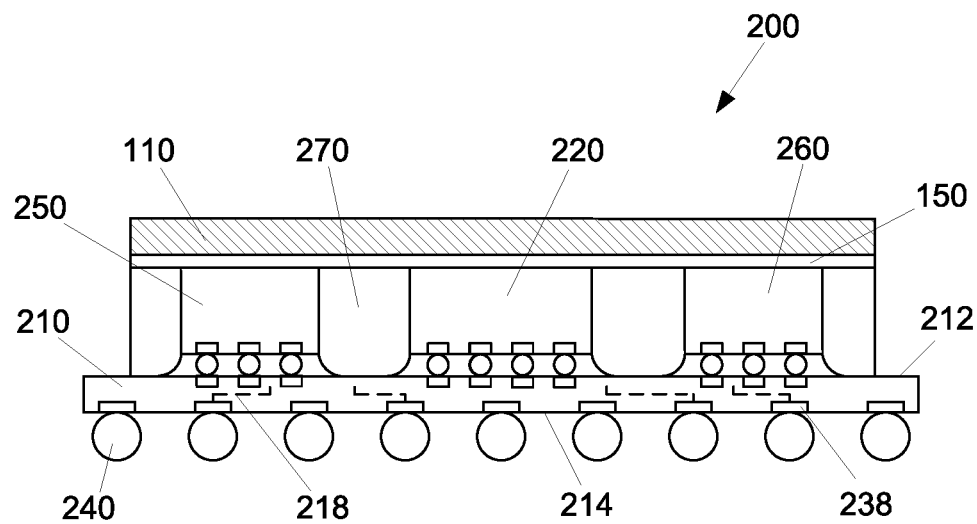

The electronic substrate 210 may further include conductive routes 218 (shown in dashed lines) extending through the electronic substrate 210. As will be understood to those skilled in the art, the conductive routes 218 may be a combination of conductive traces (not shown) and conductive vias (not shown) extending through the plurality of dielectric material layers (not shown). These conductive traces and conductive vias are well known in the art and are not shown in FIG. 9 for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 210 may be a cored substrate or a coreless substrate. In one embodiment of the present description, the electronic substrate 210 may comprise a silicon or glass interposer. In another embodiment of the present description, the electronic substrate 210 may include active and/or passive devices.

The integrated circuit device 220 may be any appropriate device, including, but not limited to, a microprocessor, a chipset, a graphics device, a wireless device, a memory device, an application specific integrated circuit, combinations thereof, stacks thereof, or the like. As shown, the integrated circuit device 220 may each have a frontside surface 222 and an opposing backside surface 224.

In an embodiment of the present description, the integrated circuit device 220 may be electrically attached to the electronic substrate 210 with a plurality of device-to-substrate interconnects 232. In one embodiment of the present description, the device-to-substrate interconnects 232 may extend between bond pads 236 on the first surface 212 of the electronic substrate 210 and bond pads 234 on the frontside surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material. In still a further embodiment, the device-to-substrate interconnects 232 may be anisotropic conductive film.

The bond pads 234 may be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 may be disposed on the bond pads 238 on the second surface 214 of the electronic substrate 210. The external interconnects 240 may be any appropriate electrically conductive material, such as those discussed with regard to the device-to-substrate interconnects 232, as previously discussed. The external interconnects 240 may be used to attach the integrated circuit assembly 200 to an external substrate (not shown), such as a motherboard.

An electrically-insulating underfill material 242, such as an epoxy material, may be disposed between the integrated circuit device 220 and the electronic substrate 210. The underfill material 242 may be used to overcome the mechanical stress issues that can arise from thermal expansion mismatch between the electronic substrate 210 and the integrated circuit device 220. As will be understood to those skilled in the art, the underfill material 242 may be dispensed between the frontside surface 222 of the integrated circuit devices 220 and the electronic substrate 210 as a viscous liquid and then hardened with a curing process.

As will be understood, the integrated circuit assembly 200 may further include a heat dissipation device (not shown) thermally attached to the metal matrix composite layer 110. The heat dissipation device may be a heat pipe, a vapor chamber, a liquid cooling device, a cold plate, and the like.

Figure 3:
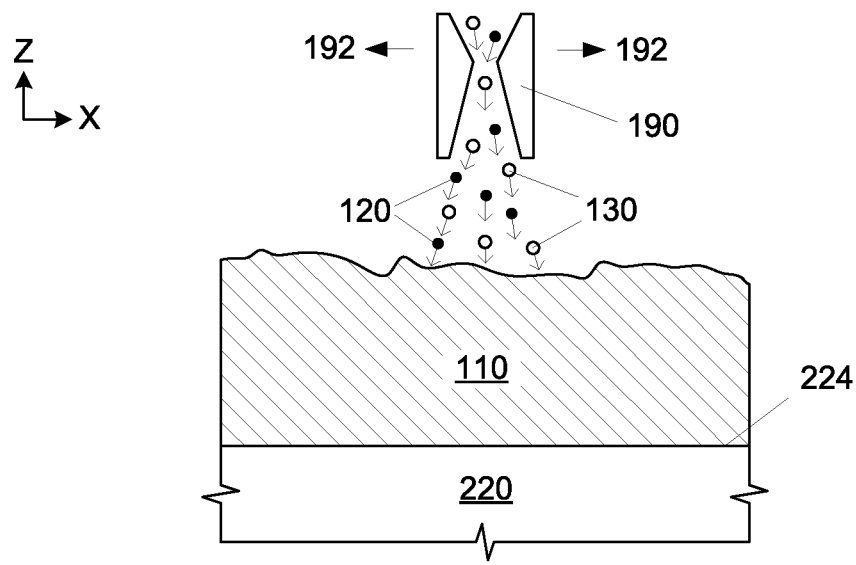
FIG. 3 is a side cross-sectional view of forming a metal matrix composite layer on a substrate, according to an embodiment of the present description.

As shown in FIG. 3, the metal matrix composite layer 110 may be formed by an additive process, such as high throughput additive manufacturing ("HTAM"). In one embodiment, the metal matrix composite layer 110 may be formed with a "coldspray" HTAM process. As the coldspray process is known in the art, it will be only concisely discussed herein. With a coldspray process, solid powders of a desired material or materials, such as the first filler material particles 120, the second filler material particles 140 (see FIG. 1), and a metal material 130, to be deposited are accelerated in a carrier jet (e.g., compressed air or nitrogen) by passing the jet through a converging diverging nozzle 190. The jet exits the nozzle 190 at a high velocity and reaches the integrated circuit device 220, where the impact causes the solid particles, such as the first filler material particles 120 and/or the metal material 130 (as illustrated), in the jet to plastically deform and bond to the integrated circuit device 220. Subsequent layers of the first filler material particles 120 and the metal material 130 similarly adhere to each underlying layer upon continued jet impact, producing fast buildup (e.g., layers that are a few hundred microns thick can be deposited over an area of about 100-1000 mm$^2$ in a few seconds). The nozzle 190 may be moved (shown as arrows 192) across the integrated circuit device 220 during the spray process. Moreover, unlike thermal spraying techniques, this approach does not require melting the particles (e.g., the first filler material particles 120 and/or the metal particles 130), thus protecting both the materials and the integrated circuit device 220 from experiencing excessive processing temperatures. In one embodiment of the present description, the metal matrix composite layer 110 may be formed at a temperature below about 150 degrees Celsius. Because additive manufacturing, such as coldspray, is used, it eliminates the need for using lithography and the many steps associated with it (resist deposition, exposure, resist development, and resist removal) that are characteristic of subtractive or semi-additive methods, such as plating, sputtering, and the like. Additionally, 3D topography can be easily created, if needed, as will be understood to those skilled in the art.

The metal matrix composite layer 110 of the various embodiments of the present description can be formed by changing the size (i.e., average diameter) of filler material particles used in the feed powder as the metal matrix composite layer 110 builds up. In one embodiment of the present description, the metal matrix composite layer 110 may be formed by starting with the first filler material particles 120 along with the metal material 130 in the feed powder when the metal matrix composite layer 110 is being initially sprayed, and then switching to the second filler material particles 140 along with the metal material 130 in the feed powder once a predetermined thickness is reached. This process may result in the structure shown in FIG. 4. As shown therein, the metal matrix composite layer 110 may have the inner surface 112 and the opposing outer surface 114, wherein the inner surface 112 abuts the backside surface 224 of the integrated circuit device 220. The metal matrix composite layer 110 may include the smaller first filler material particles 120 within the metal material 130 proximate the backside surface 224 of the integrated circuit device 220 to maximize the volume of filler in a small filler region 126 and minimize the effective coefficient of thermal expansion of the metal matrix composite layer 110 on the integrated circuit device 220. Further away from the backside surface 224 of the integrated circuit device 220, the metal matrix composite layer 110 incorporates the larger second filler material particles 140 to minimize the effective thermal interfacial resistance between the second filler material particles 140 and the metal material 130 in a large filler region 146, and thus increase the effective thermal conductivity of the metal matrix composite layer 110.

In another embodiment of the present description, the metal matrix composite layer 110 may be formed by starting with the first filler material particles 120 along with the metal material 130 in the feed powder when the metal matrix composite layer 110 is being initially sprayed, and then reducing the fraction of the first filler material particles 120 and incorporating an ever-increasing fraction of the second filler material particles 140 in the feed powder to make a more gradual gradient in the metal matrix composite layer 110. This process may result in the structure shown in FIG. 5. As shown therein, the metal matrix composite layer 110 may have the inner surface 112 and the opposing outer surface 114, wherein the inner surface 112 abuts the backside surface 224 of the integrated circuit device 220. The metal matrix composite layer 110 may include a higher concentration of the smaller first filler material particles 120 within the metal material 130 proximate the backside surface 224 of the integrated circuit device 220 to maximize the volume of filler in the small filler region 126 and minimize the effective coefficient of thermal expansion of the metal matrix composite layer 110 on the integrated circuit device 220. Further away from the backside surface 224 of the integrated circuit device 220, the metal matrix composite layer 110 gradually incorporates the larger second filler material particles 140 to minimize the effective thermal interfacial resistance between the second filler material particles 140 and the metal material 130 in the large filler region 146, and thus increase the effective thermal conductivity of the metal matrix composite layer 110.

Figure 4:
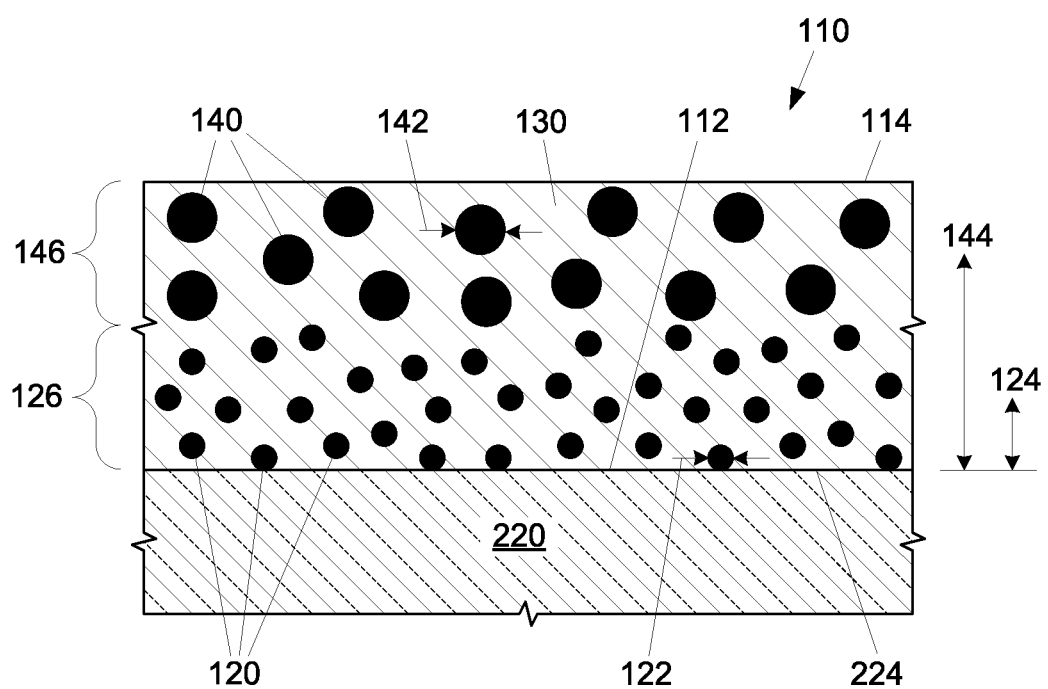
FIGS. 4-6 is a side cross-sectional views of filler particle distribution within the metal material of the metal matrix composite layer, according to various embodiments of the present description.
Figure 5:
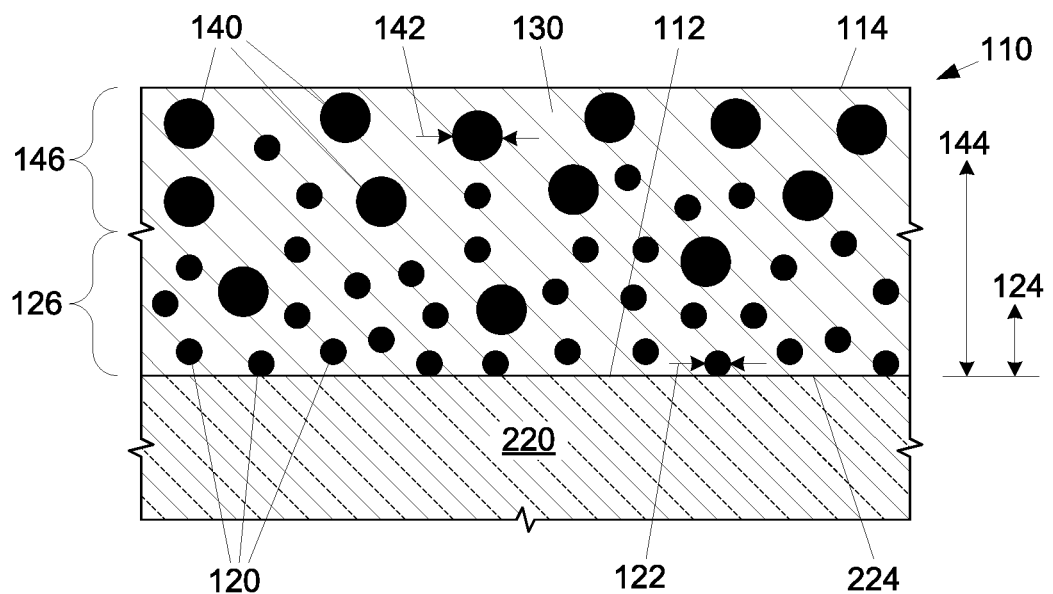
Figure 6:
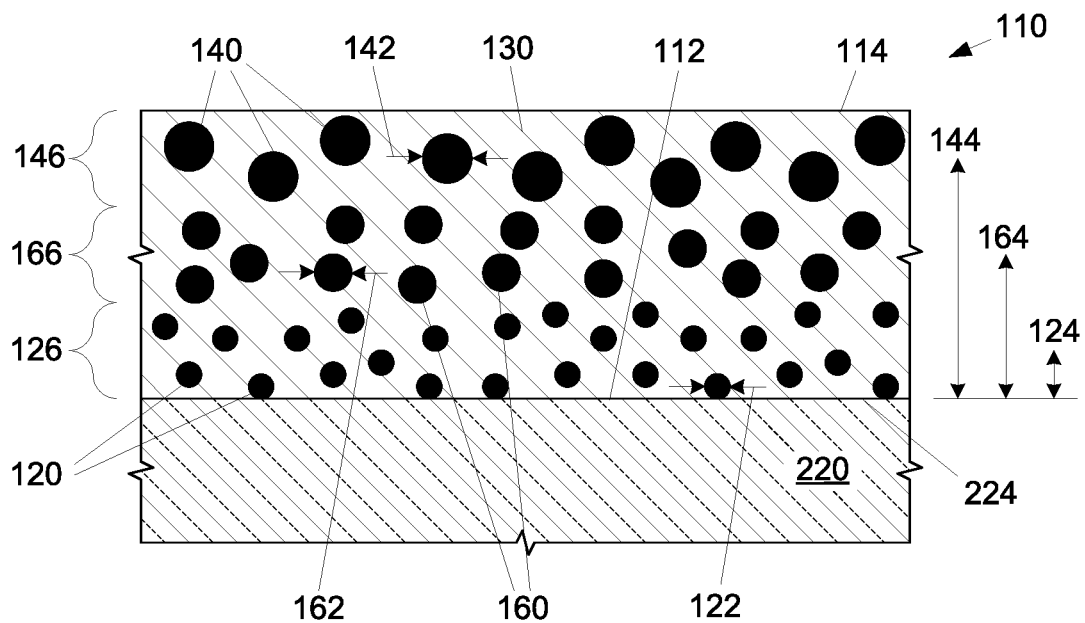

Although the embodiments of FIGS. 1, 4, and 5 utilize two filler material particle sizes (i.e., first filler material particles 120 and second filler material particles 140), the embodiments of the present description are not so limited and may include any appropriate number of filler material particle sizes. By way of example, in another embodiment of the present description, as shown in FIG. 6, the metal matrix composite layer 110 may include a plurality of intermediate filler material particles 160 positioned within the metal material 130 in an intermediate filler region 166 between the small filler region 126 and the large filler region 146. The plurality of intermediate filler material particles 160 may have an average diameter 162 that is larger than the average diameter 122 of the plurality of first filler material particles 120 and that is smaller than the average diameter 142 of the plurality of second filler material particles 140. Furthermore, the plurality of intermediate filler material particles 160 may have an average distance 164 from the backside surface 224 of the integrated circuit device 220 that is greater than the average distance 124 of the plurality of first filler material particles 120 from the backside surface 224 of the integrated circuit device 220 and that is less than the average distance 144 of the plurality of second filler material particles 140 from the backside surface 224 of the integrated circuit device 220.

Figure 7:
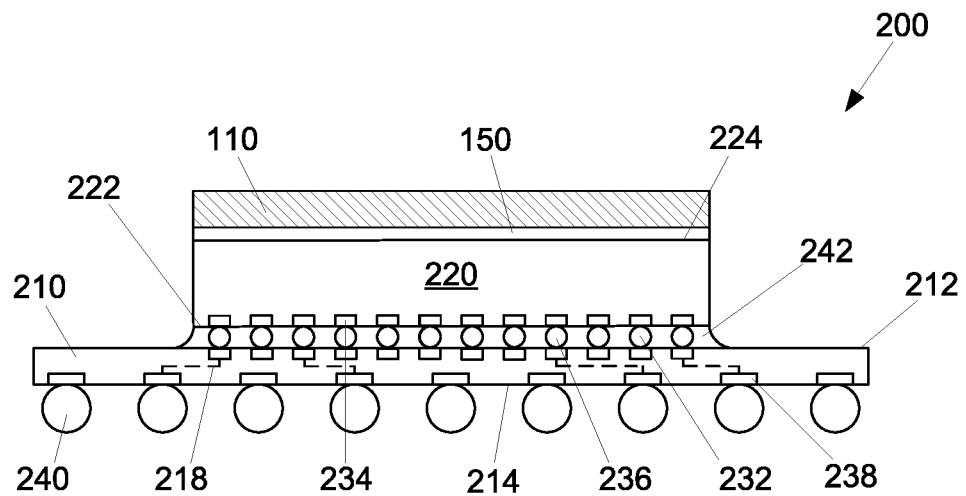
FIG. 7 is a side cross-sectional view of an integrated circuit assembly with an intermediate layer disposed between the integrated circuit device and the metal matrix composite layer, according to an embodiment of the present description.

In one embodiment of the present description, the metal matrix composite layer 110 may be formed to directly contact the backside surface 224 of the integrated circuit device 220, as shown in FIGS. 4-6. In other embodiments of the present description, at least one intermediate layer 150 may be formed between the backside surface 224 and the metal matrix composite layer 110, as shown in FIG. 7. The intermediate layer 150 may be formed as a buffer layer to protect the integrated circuit device 220 from abrasion during deposition of the metal matrix composite layer 110, formed as a diffusion layer to prevent the metal matrix composite layer 110 from diffusing into the integrated circuit device 220, formed as an adhesion promotion layer, or formed for other purposes. Although the intermediate layer 150 is illustrated as a single layer in FIG. 7, it is understood that the intermediate layer 150 may consist of one or more layers of different materials. In one embodiment of the present description, the intermediate layer 150 may be any appropriate material, including, but not limited to, titanium, nickel, vanadium, gold, nitride materials, or combinations of those or other materials. In an embodiment of the present description, the intermediate layer may be between about 10 and 500 nanometers.

Depending on the materials used, the metal matrix composite layer 110 may be susceptible to oxidation and/or corrosion over time. Thus, in one embodiment of the present description, a capping layer (not shown) may be deposited on the metal matrix composite layer 110 to protect against those risks, as will be understood to those skilled in the art.

Figure 8:
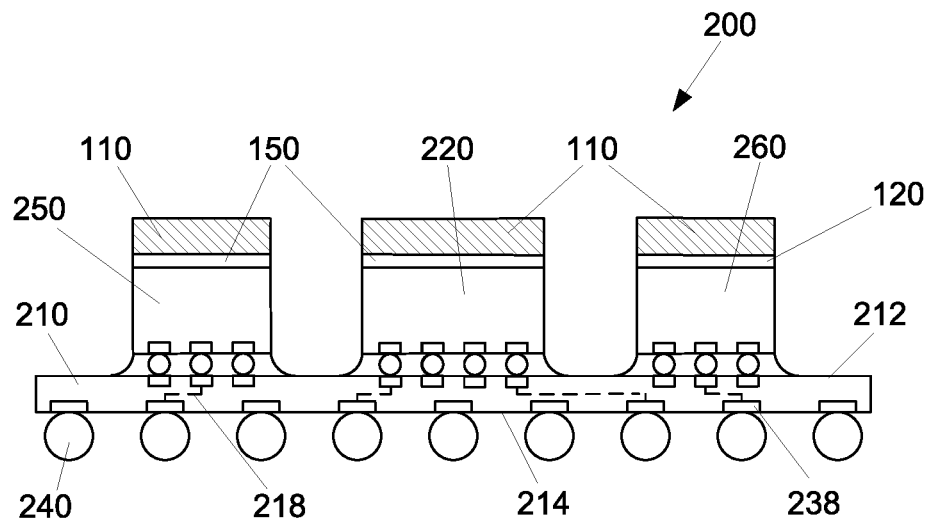
FIGS. 8-10 are side cross-sectional views of a multi-chip integrated circuit assemblies, according to various embodiments of the present description.
Figure 10:
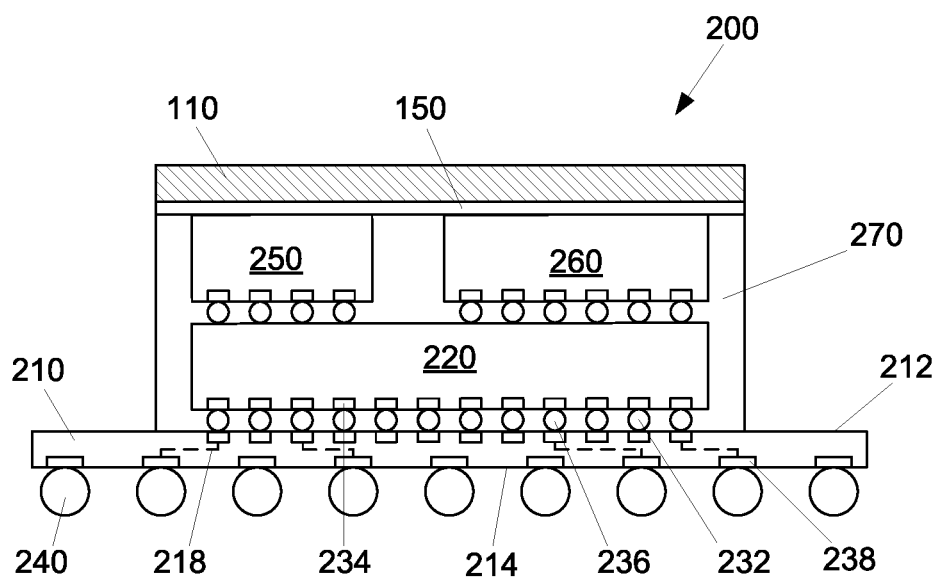

Although FIGS. 1-7 illustrate and/or discuss a single integrated circuit device 220, the embodiments of the present description are not so limited. As illustrated in FIG. 8, the integrated circuit package 200 may comprise a plurality of integrated circuit devices (i.e., the integrated circuit device 220, a first additional integrated circuit device 250, and a second additional integrated circuit device 260) electrically attached to the electronic substrate 210, wherein each integrated circuit device includes individual metal matrix composite layers 110 formed thereon. In another embodiment illustrated in FIG. 9, the configuration of FIG. 8 may include an encapsulation material 270 surrounding the integrated circuit device 220, the first additional integrated circuit device 250, and the second additional integrated circuit device 260, such that a single metal matrix composite layer 110 may span all of the integrated circuit devices. In still a further embodiment as shown in FIG. 10, the integrated circuit package 200 may comprise a stacked configuration, wherein the integrated circuit device 220 is electrically attached to the electronic substrate 210, and the first additional integrated circuit device 250 and the second additional integrated circuit device 260 are stacked on and electrically attached to the integrated circuit device 220. The encapsulation material 270 may surround the integrated circuit device 220, the first additional integrated circuit device 250, and the second additional integrated circuit device 260, such that a single metal matrix composite layer 110 may span the first additional integrated circuit device 250, and the second additional integrated circuit device 260. The encapsulation material 270 may be any appropriate material, including organic and inorganic materials, such as silicon oxide, silicon nitride, metal, epoxy molding compounds, and the like.

Figure 11:
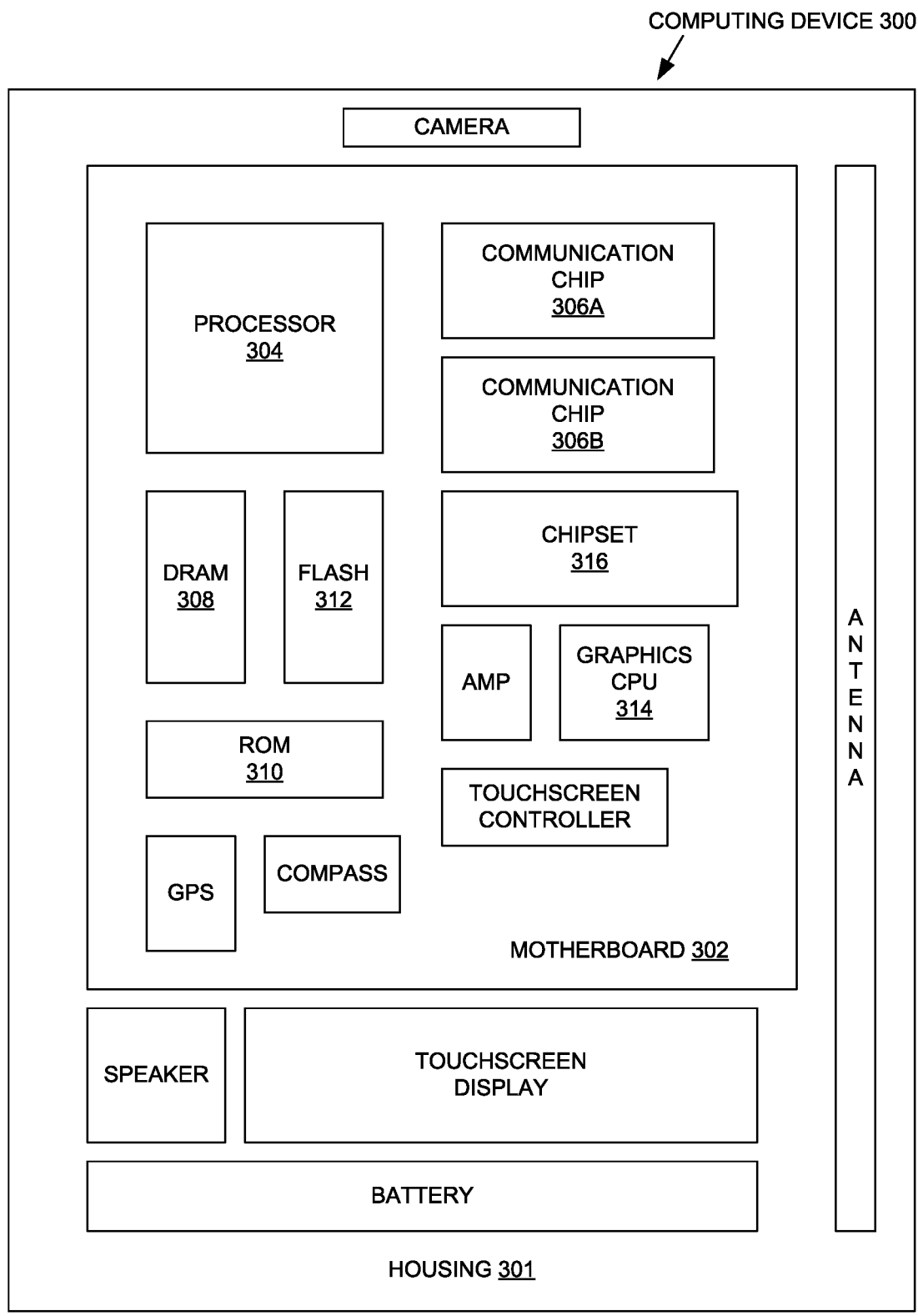
FIG. 11 is an electronic system, according to one embodiment of the present description.

FIG. 11 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit device having a metal matrix composite film formed on a backside surface thereof. The metal matrix composite film may comprise any of the embodiments of present description.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-11. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus, comprising a metal matrix composite layer having an inner surface and an opposing outer surface, wherein the metal matrix composite layer comprises a metal material; and a filler material dispersed in the metal material, wherein the filler material comprises a plurality of first filler material particles having an average diameter and an average distance from the inner surface of the metal matrix composite and a plurality of second filler material particles having an average diameter and average distance from the inner surface of the metal matrix composite material, wherein the average diameter of the plurality of first filler material particles is smaller than the average diameter of the plurality of second filler material particles, and wherein the average distance of the plurality of first filler material particles from the inner surface of the metal matrix composite layer is smaller than the average distance of the plurality of second filler material particles from the inner surface of the metal matrix composite layer.

In Example 2, the subject matter of Example 1 can optionally include the plurality of first filler material particles being the same material as the plurality of the second filler material particles.

In Example 3, the subject matter of Example 1 can optionally include the plurality of the first filler material particles being a different material from the plurality of the second filler material particles.

In Example 4, the subject matter of any of Examples 1 to 3 can optionally include the metal material being selected from the group consisting of copper, aluminum, nickel, silver, gold, and alloys thereof.

In Example 5, the subject matter of any of Examples 1 to 4 can optionally include the plurality of first filler material particles is selected from the group consisting of diamond, aluminum nitride, and silicon carbide.

In Example 6, the subject matter of any of Examples 1 to 5 can optionally include the plurality of second filler material particles is selected from the group consisting of diamond, aluminum nitride, and silicon carbide.

In Example 7, the subject matter of any of Examples 1 to 6 can optionally include a plurality of intermediate filler material particles within the metal material, wherein the plurality of intermediate filler material particles has an average diameter that is larger than the average diameter of the plurality of first filler material particles and that is smaller than the average diameter of the plurality of second filler material particles, and wherein the plurality of intermediate filler material particles has an average distance from the inner surface of the metal matrix composite layer that is greater than the average distance of the plurality of first filler material particles from the inner surface of the metal matrix composite layer and that is less than the average distance of the plurality of second filler material particles from the inner surface of the metal matrix composite layer.

Example 8 is an apparatus, comprising at least one integrated circuit device; and metal matrix composite layer having an inner surface and an opposing outer surface, wherein the metal matrix composite layer comprises a metal material; and a filler material dispersed in the metal material, wherein the filler material comprises a plurality of first filler material particles having an average diameter and an average distance from the inner surface of the metal matrix composite and a plurality of second filler material particles having an average diameter and average distance from the inner surface of the metal matrix composite material, wherein the average diameter of the plurality of first filler material particles is smaller than the average diameter of the plurality of second filler material particles, and wherein the average distance of the plurality of first filler material particles from the at least one integrated circuit device is smaller than the average distance of the plurality of second filler material particles from the at least one integrated circuit device.

In Example 9, the subject matter of Example 8 can optionally include the plurality of first filler material particles being the same material as the plurality of the second filler material particles.

In Example 10, the subject matter of Example 8 can optionally include the plurality of the first filler material particles being a different material from the plurality of the second filler material particles.

In Example 11, the subject matter of any of Examples 8 to 10 can optionally include the metal material being selected from the group consisting of copper, aluminum, nickel, silver, gold, and alloys thereof.

In Example 12, the subject matter of any of Examples 8 to 11 can optionally include the plurality of first filler material particles is selected from the group consisting of diamond, aluminum nitride, and silicon carbide.

In Example 13, the subject matter of any of Examples 8 to 12 can optionally include the plurality of second filler material particles is selected from the group consisting of diamond, aluminum nitride, and silicon carbide.

In Example 14, the subject matter of any of Examples 8 to 13 can optionally include a plurality of intermediate filler material particles within the metal material, wherein the plurality of intermediate filler material particles has an average diameter that is larger than the average diameter of the plurality of first filler material particles and that is smaller than the average diameter of the plurality of second filler material particles, and wherein the plurality of intermediate filler material particles has an average distance from the inner surface of the metal matrix composite layer that is greater than the average distance of the plurality of first filler material particles from the inner surface of the metal matrix composite layer and that is less than the average distance of the plurality of second filler material particles from the inner surface of the metal matrix composite layer.

In Example 15, the subject matter of any of Examples 8 to 14 can optionally include the metal matrix composite layer abutting the integrated circuit device.

In Example 16, the subject matter of any of Examples 8 to 14 can optionally include at least one intermediate layer between the metal matrix composite layer and the integrated circuit device.

In Example 17, the subject matter of Example 16 can optionally include the at least one intermediate layer comprising an abrasion buffer.

Example 18 is an electronic system, comprising an electronic board; and an integrated circuit assembly electrically attached to the electronic board, wherein the integrated circuit assembly comprises at least one integrated circuit device; and metal matrix composite layer having an inner surface and an opposing outer surface, wherein the metal matrix composite layer comprises a metal material; and a filler material dispersed in the metal material, wherein the filler material comprises a plurality of first filler material particles having an average diameter and an average distance from the inner surface of the metal matrix composite and a plurality of second filler material particles having an average diameter and average distance from the inner surface of the metal matrix composite material, wherein the average diameter of the plurality of first filler material particles is smaller than the average diameter of the plurality of second filler material particles, and wherein the average distance of the plurality of first filler material particles from the at least one integrated circuit device is smaller than the average distance of the plurality of second filler material particles from the at least one integrated circuit device.

In Example 19, the subject matter of Example 18 can optionally include the plurality of first filler material particles being the same material as the plurality of the second filler material particles.

In Example 20, the subject matter of Example 18 can optionally include the plurality of the first filler material particles being a different material from the plurality of the second filler material particles.

In Example 21, the subject matter of any of Examples 18 to 20 can optionally include the metal material being selected from the group consisting of copper, aluminum, nickel, silver, gold, and alloys thereof.

In Example 22, the subject matter of any of Examples 18 to 21 can optionally include the plurality of first filler material particles is selected from the group consisting of diamond, aluminum nitride, and silicon carbide.

In Example 23, the subject matter of any of Examples 18 to 22 can optionally include the plurality of second filler material particles is selected from the group consisting of diamond, aluminum nitride, and silicon carbide.

In Example 24, the subject matter of any of Examples 18 to 23 can optionally include a plurality of intermediate filler material particles within the metal material, wherein the plurality of intermediate filler material particles has an average diameter that is larger than the average diameter of the plurality of first filler material particles and that is smaller than the average diameter of the plurality of second filler material particles, and wherein the plurality of intermediate filler material particles has an average distance from the inner surface of the metal matrix composite layer that is greater than the average distance of the plurality of first filler material particles from the inner surface of the metal matrix composite layer and that is less than the average distance of the plurality of second filler material particles from the inner surface of the metal matrix composite layer.

In Example 25, the subject matter of any of Examples 18 to 24 can optionally include the metal matrix composite layer abutting the integrated circuit device.

In Example 26, the subject matter of any of Examples 18 to 24 can optionally include at least one intermediate layer between the metal matrix composite layer and the integrated circuit device.

In Example 27, the subject matter of Example 26 can optionally include the at least one intermediate layer comprising an abrasion buffer.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a metal matrix composite layer having an inner surface and an opposing outer surface, wherein the metal matrix composite layer comprises:
   a metal material; and
   a filler material dispersed in the metal material, wherein the filler material comprises a plurality of first filler material particles having an average diameter and an average distance from the inner surface of the metal matrix composite layer and a plurality of second filler material particles having an average diameter and an average distance from the inner surface of the metal matrix composite layer, wherein the plurality of first filler material particles is the same material as the plurality of second filler material particles, wherein the average diameter of the plurality of first filler material particles is smaller than the average diameter of the plurality of second filler material particles, and wherein the average distance of the plurality of first filler material particles from the inner surface of the metal matrix composite layer is smaller than the average distance of the plurality of second filler material particles from the inner surface of the metal matrix composite layer.

2. The apparatus of claim 1, wherein the metal material comprises one of copper, aluminum, nickel, silver, or gold.

3. The apparatus of claim 1, wherein the plurality of first filler material particles and the plurality of second filler material particles comprise one of diamond, aluminum nitride, and silicon carbide.

4. The apparatus of claim 1, wherein the plurality of first filler material particles and the plurality of second filler material particles both comprise diamond.

5. The apparatus of claim 4, wherein the metal material comprises silver.

6. The apparatus of claim 1, further comprising a plurality of intermediate filler material particles within the metal material, wherein the plurality of intermediate filler material particles is the same material as the plurality of first filler material particles and the plurality of second filler material particles, wherein the plurality of intermediate filler material particles has an average diameter that is larger than the average diameter of the plurality of first filler material particles and that is smaller than the average diameter of the plurality of second filler material particles, and wherein the plurality of intermediate filler material particles has an average distance from the inner surface of the metal matrix composite layer that is greater than the average distance of the plurality of first filler material particles from the inner surface of the metal matrix composite layer and that is less than the average distance of the plurality of second filler material particles from the inner surface of the metal matrix composite layer.

7. The apparatus of claim 1, further comprising:
at least one integrated circuit device coupled to the inner surface of the metal matrix composite layer.

8. The apparatus of claim 7, wherein the metal matrix composite layer abuts the integrated circuit device.

9. The apparatus of claim 7, further comprising at least one intermediate layer between the metal matrix composite layer and the integrated circuit device.

10. The apparatus of claim 9, wherein the at least one intermediate layer comprises an abrasion buffer.

11. The apparatus of claim 9, wherein the at least one intermediate layer comprises one of titanium, nickel, vanadium, gold, or nickel.

12. The apparatus of claim 7, further comprising:
an electronic board; and
an integrated circuit assembly attached to the electronic board, the integrated circuit assembly comprising the at least one integrated circuit device and the metal matrix composite layer.

13. An apparatus, comprising:
at least one integrated circuit device;
an intermediate layer on the at least one integrated circuit device, the intermediate layer comprising one of titanium, nickel, vanadium, gold, or nickel and having a thickness in a range of 10 to 500 nanometers; and
a metal matrix composite layer on the intermediate layer, wherein the metal matrix composite layer comprises:
a metal material; and
a filler material, wherein the filler material comprises a plurality of first filler material particles having an average diameter and an average distance from the at least one integrated circuit device and a plurality of second filler material particles having an average diameter and an average distance from the at least one integrated circuit device, wherein the plurality of first filler material particles and the plurality of second filler material particles each comprise one of diamond, aluminum nitride, or silicon carbide, wherein the average diameter of the plurality of first filler material particles is smaller than the average diameter of the plurality of second filler material particles, and wherein the average distance of the plurality of first filler material particles from the at least one integrated circuit device is smaller than the average distance of the plurality of second filler material particles from the at least one integrated circuit device.

14. The apparatus of claim 13, wherein the metal material comprises one of copper, aluminum, nickel, silver, or gold.

15. The apparatus of claim 13, wherein the plurality of first filler material particles and the plurality of second filler material particles each comprise diamond.

16. The apparatus of claim 15, wherein the metal material comprises silver.

17. The apparatus of claim 13, further comprising a plurality of intermediate filler material particles within the metal material, wherein the plurality of intermediate filler material particles has an average diameter that is larger than the average diameter of the plurality of first filler material particles and that is smaller than the average diameter of the plurality of second filler material particles, and wherein the plurality of intermediate filler material particles has an average distance from the at least one integrated circuit device that is greater than the average distance of the plurality of first filler material particles the at least one integrated circuit device and that is less than the average distance of the plurality of second filler material particles from the at least one integrated circuit device.

18. The apparatus of claim 17, wherein the plurality of intermediate filler material particles is the same material as the plurality of first filler material particles and the plurality of second filler material particles.

19. The apparatus of claim 13, wherein the intermediate layer comprises an abrasion buffer.

20. The apparatus of claim 13, further comprising:
an electronic board; and
an integrated circuit assembly attached to the electronic board, the integrated circuit assembly comprising the at least one integrated circuit device, the intermediate layer, and the metal matrix composite layer.

* * * * *